(12) United States Patent
Kameya

(10) Patent No.: US 8,866,566 B2
(45) Date of Patent: *Oct. 21, 2014

(54) COMMON MODE FILTER

(75) Inventor: Masaaki Kameya, Kanagawa (JP)

(73) Assignee: Elmec Corporation, Kawasaki-shi (JP)

( * ) Notice: Subject to any disclaimer, the term of this patent is extended or adjusted under 35 U.S.C. 154(b) by 417 days.

This patent is subject to a terminal disclaimer.

(21) Appl. No.: 12/884,904

(22) Filed: Sep. 17, 2010

(65) Prior Publication Data

US 2011/0074525 A1    Mar. 31, 2011

(30) Foreign Application Priority Data

Sep. 25, 2009   (JP) .................... 2009-220549

(51) Int. Cl.
| | |
|---|---|
| H03H 7/075 | (2006.01) |
| H03H 7/01 | (2006.01) |
| H03H 7/32 | (2006.01) |
| H03H 7/09 | (2006.01) |
| H03H 1/00 | (2006.01) |

(52) U.S. Cl.
CPC ........... *H03H 7/0115* (2013.01); *H03H 7/1708* (2013.01); *H03H 2001/0085* (2013.01); *H03H 7/32* (2013.01); *H03H 7/09* (2013.01); *H03H 7/075* (2013.01)
USPC ............................................. 333/181; 333/12

(58) Field of Classification Search
CPC ............................. H03H 7/075; H03H 7/0115
USPC .................... 333/181, 12, 167, 4, 5
See application file for complete search history.

(56) References Cited

U.S. PATENT DOCUMENTS

| | | | |
|---|---|---|---|
| 1,866,525 A | 7/1932 | Carter | |
| 1,942,488 A | 1/1934 | Henry et al. | |
| 3,681,701 A * | 8/1972 | Maier | 327/552 |
| 4,383,229 A * | 5/1983 | Jones | 333/176 |

(Continued)

FOREIGN PATENT DOCUMENTS

| | | |
|---|---|---|
| FR | 2 909 239 A1 | 5/2008 |
| JP | 53-025333 A | 3/1978 |

(Continued)

OTHER PUBLICATIONS

Electromagnetic Delay Lines; http://www.rhombus-ind.com/app-note/passive.pdf, Jun. 2001.*

*Primary Examiner* — Benny Lee
*Assistant Examiner* — Rakesh Patel
(74) *Attorney, Agent, or Firm* — Westerman, Hattori, Daniels & Adrian, LLP

(57) ABSTRACT

To pass an ultra high-speed differential signal and make it difficult to pass a common mode noise. Lumped—constant differential delay line DL is formed by arranging inductors Lo, being passive series elements, and capacitors Co, being passive parallel elements, in a differential four terminal network of a ladder shape composed of the passive series elements and the passive parallel elements arranged in differential lines 1 and 3. The lumped-constant differential delay line DL is composed of capacitors Co including two capacitors Co/2 and Co/2, or Co and Co equivalent to the aforementioned capacitors, having equal values, and connected in series. Inductors L1 to L4 for attenuating a common mode noise are connected between connection points of the capacitors Co/2 and Co/2 or Co and Co connected in series, and a ground potential, so that attenuation poles are formed for attenuating the common mode noise together with the capacitors Co/2 and Co.

6 Claims, 19 Drawing Sheets

(56) References Cited

U.S. PATENT DOCUMENTS

| | | | | |
|---|---|---|---|---|
| 4,761,623 | A | * | 8/1988 | Schneider .................... 333/167 |
| 4,888,675 | A | * | 12/1989 | Kumar et al. ................... 363/47 |
| 6,031,435 | A | * | 2/2000 | Inose et al. ................... 333/193 |
| 6,696,903 | B1 | * | 2/2004 | Kawahara et al. ............ 333/134 |
| 6,975,841 | B2 | * | 12/2005 | Uriu et al. ....................... 455/78 |
| 2005/0219011 | A1 | | 10/2005 | Lin et al. |
| 2008/0197936 | A1 | * | 8/2008 | Berg ............................. 333/103 |
| 2012/0075036 | A1 | * | 3/2012 | Kameya ........................ 333/140 |

FOREIGN PATENT DOCUMENTS

| | | |
|---|---|---|
| JP | 2000-058343 A | 2/2000 |
| JP | 2004-266634 A | 9/2004 |
| JP | 2008-078717 A | 4/2008 |

* cited by examiner ladder-shaped differential four terminal network

PRIOR ART

PRIOR ART

PRIOR ART

PRIOR ART

PRIOR ART

COMMON MODE FILTER

TECHNICAL FIELD

The present invention relates to a common mode filter, and particularly relates to the common mode filter capable of cutting off a common mode noise and hardly causing an electromagnetic interference to occur, while passing an ultrahigh speed differential signal which is propagated through the ultrahigh-speed differential line.

DESCRIPTION OF RELATED ART

In an electronic device, noise is an undesirable presence, and therefore many proposals have been proposed for removing the noise.

Generally, the noise includes a differential mode noise (normal mode noise) and a common mode noise, and a frequency range in which the noise exists and a method for removing the noise are classified as follows.

(1) A case that the noise exists in a specific frequency range and a signal to be transmitted exists in a further lower frequency range than the above frequency range.

A first method is a method of forming a lumped-constant resonance circuit in which inductors and capacitors are combined, and removing a frequency component in the vicinity of its resonance frequency.

For example, Japanese Patent Laid Open Publication NO. 1978-25333 (Patent document 1) can be given as a publicly-known example of the aforementioned method of removing the noise.

The patent document 1 provides a method of connecting two capacitors and one coil in Y-shape, to thereby form a plurality of series resonance circuits; then removing a noise in a specific range generated from a portable power tool by using the resonance circuit; and preventing the noise from being outputted to a power line.

A second method is a method of forming a lumped-constant type low-pass filter in which the inductors and the capacitors are combined, and removing the frequency component of more than an interrupting frequency of this filter.

For example, Japanese Patent Laid Open Publication No. 2008-78717 (Patent document 2) can be given as a publicly-known example of the aforementioned method of removing the noise.

The patent document 2 provides a method of removing the normal mode noise by the low-pass filter in which the inductors and the capacitors are combined, then removing the common mode noise by a common mode choke coil, and preventing a switching power noise from being outputted to the power line.

(2) A case that both the noise and a differential signal to be transmitted, exist in the same specific frequency range, and the differential signal is a normal mode signal.

In this case, the common mode choke coil is used.

As a publicly-known example of the aforementioned method, Japanese Patent Laid Open Publication No. 2004-266634 (patent document 3) can be given, wherein a lower limit of a frequency band of the normal mode signal is set to 2 MHz, and Japanese Patent Laid Open Publication No. 2000-58343 (patent document 4) can be given, wherein the common mode choke coil for transmitting the differential signal is wound on a toroidal core.

In recent years, higher frequency band has been used, and for example, according to the specification of USB (universal series bus) 2.0 formulated in April, 2000, a maximum data transmission speed is set to 480M bits/second (clock frequency 240 MHz), and a transmission signal is converted to a differential signal in this frequency band.

Incidentally, as shown in an equivalent circuit of FIG. 18, an ideal common mode choke coil has a structure in which a transmission line is formed by a pair of coils wound around a magnetic core with coupling coefficient set to be close to "1", and an inter-coils capacitor with inter-wiring capacitance between input and output suppressed to be low, so that characteristic impedance is controlled.

In this common mode choke coil, equivalent inductance inserted to a transmission line is a great value relative to a common mode noise, and therefore as shown in the characteristics shown by Scc21 of FIG. 19, transmission of the common mode noise can be cut-off.

Meanwhile, in the common mode choke coil, the inductance is closer to zero, relative to the differential signal (normal mode signal), and a low-loss transmission line is formed in combination with the inter-wire capacitor, and therefore as is clarified from the characteristics shown by Sdd21 of FIG. 19, the differential signal is transmitted with low loss.

Although such an ideal common mode choke coil, with pass band set to 15 GHz, has not been put to practical use at present, explanation therefore is given for comparison with an effect of the present invention.

Conventionally, the common mode choke coil has a simple structure and capable of cutting-off the common mode noise in the same frequency band by allowing a high-speed differential signal to pass without loss, and therefore has been widely used in a countermeasure against noise in a high-speed interface serial transmission.

In recent years, the specification of interface USB3.0 (maximum data transmission speed is 5 Gbits/second=clock frequency 2.5 GHz) is formulated in November, 2008.

In a case that the clock frequency is set to 2.5 GHz, in order to prevent a waveform deterioration, the differential signal, being an interface line, is preferably transmitted with a flat group delay characteristics without deterioration of amplitude, until 7.5 GHz, being harmonics of three times of the clock frequency, and also, the common mode noise in the same band must be cut-off.

However, in this GHz band, magnetic permeability of a magnetic body is decreased, thus also decreasing the coupling coefficient between inductors, and an influence of a distribution capacitance is great.

If specifically simulated, although depending on a manner of simulation, in FIG. 18, when the coupling coefficient between inductors is decreased drastically from 0.98 to 0.97, the pass band for the differential signal is reduced drastically to half.

The noise, which is a problem in the differential transmission line, is mainly the common mode noise. Then, there are a plurality of proposals regarding the common mode filter before the aforementioned USB3.0 specification is formulated, and most of them are related to the common mode choke coil.

Even if the other proposals are included, the structure of the lumped-constant resonance circuit, in which the inductors and the capacitors are combined as described in the aforementioned noise removing means, or the low-pass filter, can not be found.

CONVENTIONAL DOCUMENTS

Patent Document (Patent Document 1)
Japanese Patent Laid Open Publication No. 1978-25333
(Patent Document 2)
Japanese Patent Laid Open Publication No. 2008-78717
(Patent Document 3)
Japanese Patent Laid Open Publication No. 2004-266634
(Patent Document 4)
Japanese Patent Laid Open Publication No. 2000-58343

SUMMARY OF THE INVENTION

Problem to be Solved by the Invention

The above-described common mode choke coil originally exhibits a function by having an inductance of zero for the differential signal, and having a larger inductance for the common mode noise.

However, if handled frequency exceeds 5 GHz, it can not be avoided to insert inductance equivalent to the differential signal circuit in series, due to the decrease of the magnetic permeability of the magnetic body, and also deterioration of the amplitude characteristics of the differential signal involving the deterioration of linearity of the group delay characteristics, can not be avoided due to addition of distributed capacitance. Accordingly, there is a limit in improving the performance of the common mode choke coil.

Further, the common mode choke coil cuts-off the common mode noise by a great inductance, namely, by high serial impedance. Therefore, an input terminal of the coil is located closer to a terminal end portion viewed from the common mode noise, and the common mode noise applied to the input terminal shows the same response as the response of a terminal open line at the input terminal.

Therefore, at the input terminal, the common mode noise applied to the input terminal, and the common mode noise reflected by high impedance when an inside is viewed from the input terminal, are superimposed on each other, to thereby raise a peak voltage of the common mode noise at the input terminal.

The input terminal is formed as an exposed portion to facilitate mounting, and is hardly sealed. Therefore, electromagnetic radiation is easily generated from this portion, thus causing electro magnetic interference to occur, and therefore rise of the peak voltage of the common mode noise at the input terminal is not preferable.

In order to solve the above-described problem, the present invention is provided, and an object of the present invention is to provide a common mode filter capable of securing a transmission of an ultrahigh speed differential signal on an ultrahigh speed differential line, then attenuating the common mode noise, and hardly allowing the electro magnetic interference to occur.

Means for Solving the Problem

In order to solve the above-described problem, a first aspect of the present invention provides a common mode filter, comprising:
a lumped-constant differential delay line formed by arranging inductors, being passive series elements, and capacitors, being passive parallel elements, in a ladder-shaped differential four terminal network composed of the passive series elements arranged in series in differential lines "two parallel lines" and the passive parallel elements arranged in parallel between the differential lines,
the capacitor, being the passive parallel elements including:
a lumped-constant differential delay line composed of two capacitors equivalent to the above capacitors, having equal values, and connected in series; and
inductors for attenuating a common mode noise connected between a connection point of the capacitors connected in series, and a ground potential, so that attenuation poles for attenuating the common mode noise are formed together with the capacitors.

Another aspect of the present invention provides a common mode filter, wherein the lumped-constant differential delay line is formed into a constant K-type structure.

Another aspect of the present invention provides a common mode filter, wherein the lumped-constant differential delay line is formed into a derived m-type structure.

Another aspect of the present invention provides a common mode filter, wherein the lumped-constant differential delay line is formed into all pass type structure.

Another aspect of the present invention provides a common mode filter, wherein the lumped-constant differential delay line and the inductors for attenuating the noise are formed as differential delay elements of one section, and a plurality of differential delay elements are arranged in the differential line in series in a ladder shape, thus composing a plurality of sections.

Another aspect of the present invention provides a common mode filter, wherein the lumped-constant differential delay line is a composite line comprising two or three different elements out of constant K-type, derived m-type, and all pass type differential delay elements.

Another aspect of the present invention provides a common mode filter, wherein frequencies of the attenuation poles in the differential delay elements, are set to be different from each other.

Another aspect of the present invention provides a common mode filter, wherein frequency of the attenuation pole in the differential delay elements at input/output sides of the differential line, is set higher than the frequency of the attenuation pole in the differential delay elements between the input/output sides.

Advantage Of The Invention

In the common mode filter according to one aspect of the present invention, the lumped-constant differential delay line with the inductors arranged as the passive series elements and the capacitors arranged as the passive parallel elements, is used, and the capacitors, being the parallel elements, are formed of two capacitors equivalent to the above capacitors, having equal values, and connected in series, and the inductors for attenuating the common mode noise are connected between the connection point of capacitors connected in series and the ground potential. Therefore, an undesirable common mode noise is cut-off while allowing the ultrahigh-speed differential signal to pass, and the peak voltage of the common mode noise at the input terminal portion can be reduced, and the electro magnetic interference is hardly caused.

In the common mode filter according to another aspect of the present invention, the lumped-constant differential delay line is formed into the constant K-type structure. Therefore, the aforementioned advantage can be obtained in the constant K-type structure.

In the common mode filter according to another aspect of the present invention, the lumped-constant differential delay line is formed into the derived m-type structure. Therefore, the aforementioned advantage can be obtained in the derived m-type structure.

In the common mode filter according to another aspect of the present invention, the lumped-constant differential delay line is formed into the all pass structure. Therefore, the aforementioned advantage can be obtained in the all pass structure.

In the common mode filter according to another aspect of the present invention, the lumped-constant differential delay line and the inductors for attenuating the noise are formed as differential delay elements of one section, and a plurality of differential delay elements are arranged in a differential line of the differential delay elements in series in a ladder shape, thus composing a plurality of sections. Therefore, in addition to the aforementioned advantage, various characteristics can be obtained.

In the common mode filter according to another aspect of the present invention, the lumped-constant differential delay line is a composite line comprising two or three different elements from the differential delay elements of the constant K-type, derived m-type, and all pass type structures. Therefore, the aforementioned advantage can be obtained, in various pass-type structures.

In the common mode filter according to anther aspect of the present invention, the frequency of the attenuation poles in the differential delay elements are set to be different from each other. Therefore, various characteristics such that transmission characteristic of the common mode noise is easily formed into a desired characteristic, and further the peak voltage of the common mode noise at the input terminal portion is dispersed for each frequency component. Therefore, surely the electro magnetic interference is hardly caused to occur.

In the common mode filter according to another aspect of the present invention, the frequency of the attenuation pole in the differential delay elements at input/output sides of the differential line, is set higher than the frequency of the attenuation pole in the differential delay elements between input/output sides. Therefore, values of the inductors for attenuating the noise can be prevented from being large, and these values can be easily made uniform.

DESCRIPTION OF PREFERRED EMBODIMENTS OF THE INVENTION

Preferred embodiments of a common mode filter according to the present invention will be described hereafter, with reference to the drawings.

First, a lumped-constant differential delay line, being a base of the common mode filter of the present invention, will be described.

Figure 1:
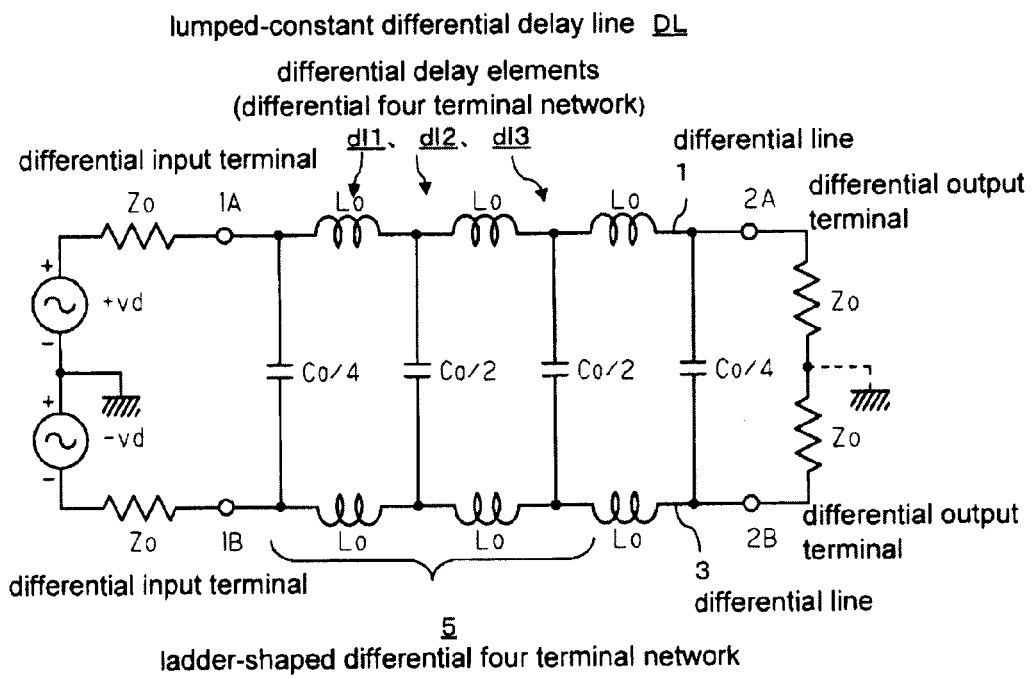
FIG. 1 is a circuit view showing an example of a lumped-constant differential delay line, being a base of a common mode filter.

FIG. 1 is a circuit view showing an example of the lumped-constant differential delay line used in the common mode filter of the present invention.

In FIG. 1, a ladder-shaped differential four terminal network 5 is formed in a pair of differential lines 1 and 3 between differential input terminals 1A, 1B, and differential output terminals 2A, 2B.

The ladder-shaped differential four terminal network 5 is formed into a ladder shape by combining and connecting passive series elements arranged in series in the differential lines 1 and 3, and passive parallel elements arranged in parallel between these differential lines 1 and 3.

Namely, a plurality of inductors Lo, being the passive series elements, for example, three inductors Lo are connected in series, in the differential line 1 between differential input/output terminals 1A and 2A, and differential line 3 between differential input/output terminals 1B and 2B, and capacitors Co/4 and Co/2, being the passive parallel elements, are connected to both ends of the individual inductor Lo. The capacitors Co/4 and Co/2 are connected between both ends of the individual inductor Lo of the differential line 1, and both ends of each inductor Lo at the same position in the differential line 3, thus forming a constant K π-type lumped-constant differential delay line DL including three sections.

Differential delay elements dl1, dl2, and dl3 of one section in the lumped-constant differential delay line DL are ladder-shaped differential four terminal network, and are formed by a pair of inductors Lo in the differential lines 1 and 3, and two capacitors Co/4 and Co/2 on both ends thereof. Capacitors Co/2 of the adjacent differential delay elements dl1 and dl2, dl2 and dl3 are shared.

In addition, a capacitance value of the capacitor Co/4 in the differential delay elements dl1, dl3 at the side of the differential input/output terminals 1A, 1B, 2A, 2B, is not shared with intermediate differential delay element dl2, and therefore the capacitance value is half of the capacitor Co/2 of the intermediate differential delay element dl2. Delay time td of each differential delay element dl1 to dl3 is expressed as shown in "Formula 1".

$$td=\sqrt{LoCo} \quad \text{[Formula 1]}$$

Characteristic impedance Zc of each differential delay element dl1 to dl3 is expressed as shown in "Formula 2".

$$Zc=2\sqrt{Lo/Co} \quad \text{[Formula 2]}$$

In FIG. 1, the capacitance of the capacitor of one section of differential delay elements dl1 to dl3 is expressed by Co/4 and Co/2, thereby making the notation of the delay time td coincide with the formula in generally known single-ended delay lines.

Note that in FIG. 1, +vd and −vd at the side of the differential input terminals 1A and 1B show differential power sources of impedance Zo, and Zo at the side of the differential output terminals 2A and 2B shows termination impedance.

Next, the common mode filter according to the present invention will be described in detail.

Figure 2:
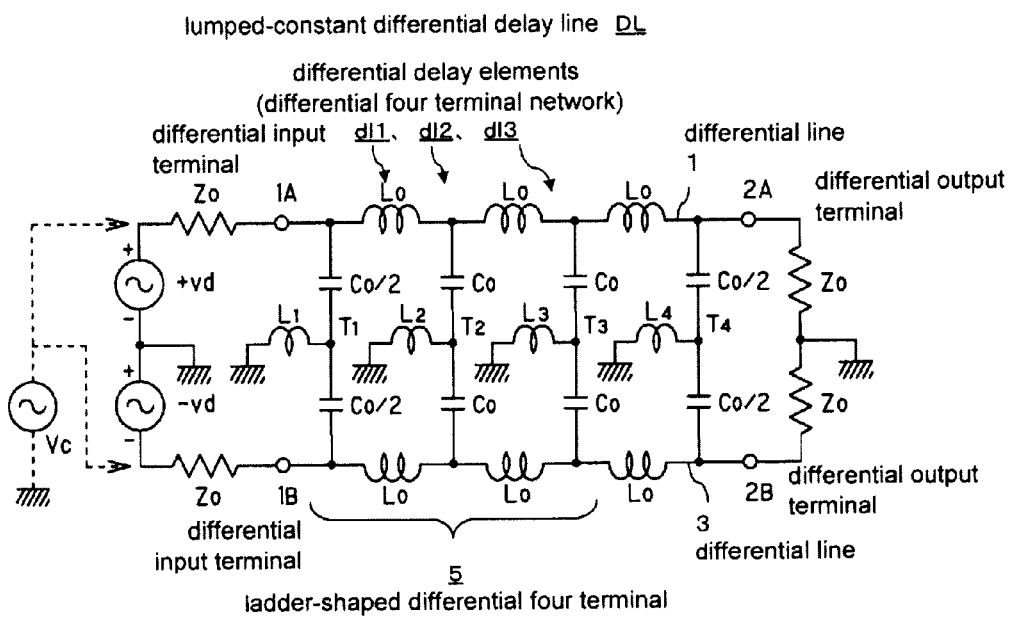
FIG. 2 is a circuit view showing the common mode filter according to a first embodiment of the present invention.

FIG. 2 is a circuit view explaining a first structure of the common mode filter of the present invention, and shows an improved lumped-constant differential delay line of FIG. 1. Vc shows a source of the common mode noise.

As shown in FIG. 2, two capacitors Co/4 and Co/2 connecting both ends of the pair of inductors Lo on the differential lines 1 and 3 in each differential delay elements dl1 to dl3, are divided into two capacitors Co/2 and Co/2 or Co and Co connected in series. In addition, series composition capacitance of the capacitors Co/2 and Co/2 are equivalent to the capacitor Co/4, and similarly the series composition capacitance of the capacitors Co and Co is equivalent to the capacitor Co/2.

Namely, the capacitance of the two divided capacitors Co/2, Co has a capacitance value of twice of one capacitor Co/4, Co/2 before being divided.

In each differential delay elements dl1 to dl3, inductors L1, L2, L3, L4 for attenuating the common mode noise are connected between each connection points T1, T2, T3, T4 of the capacitors Co/2 and Co/2 or Co and Co, and the ground potential.

A series resonance circuit is formed by combining the inductors L1 to L4 for attenuating the common mode noise, with capacitors Co/2, Co connected to each inductor, and this resonance frequency is set to be a frequency of a pole for attenuating the common mode noise. The other structure is the same as FIG. 1.

In such a common mode filter, by using the lumped-constant differential delay elements dl1 to dl3, being the aforementioned ladder-shaped four terminal network, as a ladder-shaped differential four terminal network 5 formed in the differential lines 1 and 3, the differential signal that propagates through the differential lines 1 and 3, can be passed therethrough with amplitude characteristics and group delay characteristics as aimed.

Namely, in the first structure, differential signals that transmit through the differential lines 1 and 3 are mutually antiphase signals, and therefore even if these signals reach each connection point T1 to T4 of capacitors Co/2 and capacitors Co, the signals are mutually cancelled out and disappear. Therefore, the series resonance circuit does not contribute to the differential signal, and the differential signal is transmitted without deterioration, as designed by the differential delay elements dl1 to dl3.

Meanwhile, in the first structure, the series resonance circuit for the common mode noise is formed, by two capacitors Co/2 and Co, being parallel elements that form the differential delay elements dl1 to dl3, and inductors L1 to L4 for attenuating the common mode noise connected to these connection points T1 to T4. Therefore, the common mode noise is attenuated and cut-off, thus making it possible to facilitate the attenuation of the common mode noise as designed.

Further, the cut-off common mode noise is propagated through the differential delay elements dl1 to dl3, and returns to the differential input terminals 1A and 1B, with twofold propagation delay time by reciprocation. Therefore, the common mode noise applied to differential input terminals 1A and 1B, and the common mode noise that reflects and returns, are superimposed on each other, with phases deviated from each other.

Therefore, rise of the peak voltage of the common mode noise at the differential input terminals 1A and 1B can be avoided, and the electromagnetic radiation of the noise is hardly generated at the differential input terminals 1A and 1B.

In addition, a plurality of sections are formed in the differential delay elements dl1 to dl3, and therefore by setting a constant of the series resonance circuit so that the resonance frequency is different in every section, the common mode noise is cut-off in a different series resonance circuit in every frequency component, and returns to the differential input terminals 1A and 1B, with different propagation delay time for each frequency component. Therefore, each frequency component of the common mode noise at the differential input terminals 1A and 1B is dispersed time-dividedly, and the peak voltage is further reduced.

Figure 3:
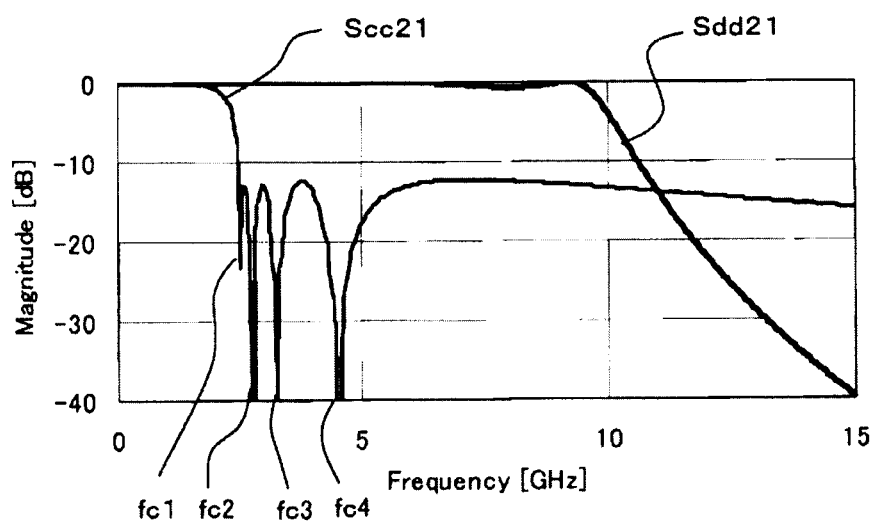
FIG. 3 is a characteristic view of the common mode filter of the present invention shown in FIG. 2.

FIG. 3 is a characteristic view of the common mode filter of the present invention shown in FIG. 2, wherein Sdd21 shows differential signal transmission characteristic and Scc21 shows common mode noise transmission characteristic in the figure. The characteristic of FIG. 3 is that the constant of each element is set, so that the delay time of one section is set to 30 ps and characteristic impedance is set to 100 ohms.

Further, each resonance frequency fc1 to fc4 of each series resonance circuit is set, so that fc1 is the series resonance frequency determined by L3 and 2×Co, which is 2.5 GHz here;

fc2 is the series resonance frequency determined by L2 and 2×Co, which is 2.76 GHz here;

fc3 is the series resonance frequency determined by L4 and Co, which is 3.25 GHz here; and fc4 is the series resonance frequency determined by L1 and Co, which is 4.5 GHz here. As a result, the attenuation of the common mode noise can be set to −12 dB or more at the frequency of 2.47 GHz or more.

Here, the capacitance for determining the series resonance frequency, corresponds to a parallel connecting portion of the capacitor Co connected to both differential lines 1 and 3. The reason is as follows. Since the common mode noise is applied to the both differential lines 1 and 3 with the same phase, the capacitors of the both differential lines 1 and 3 are equivalent to parallel connection to the common mode noise.

Further, by setting fc1 and fc2 of low series resonance frequencies in an intermediate section, inductances can be arranged by suppressing an increase of the inductances for resonance, because a resonance capacitance of the intermediate section is larger than the capacitance of both ends sections.

Figure 4:
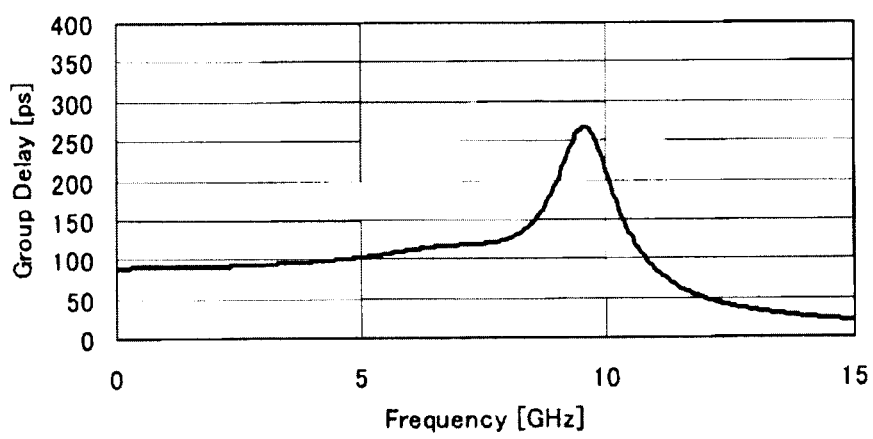
FIG. 4 is a characteristic view of the common mode filter of the present invention shown in FIG. 2.

FIG. 4 shows a group delay characteristic of the differential signal of the common mode filter according to the present invention shown in FIG. 2.

Figure 5:
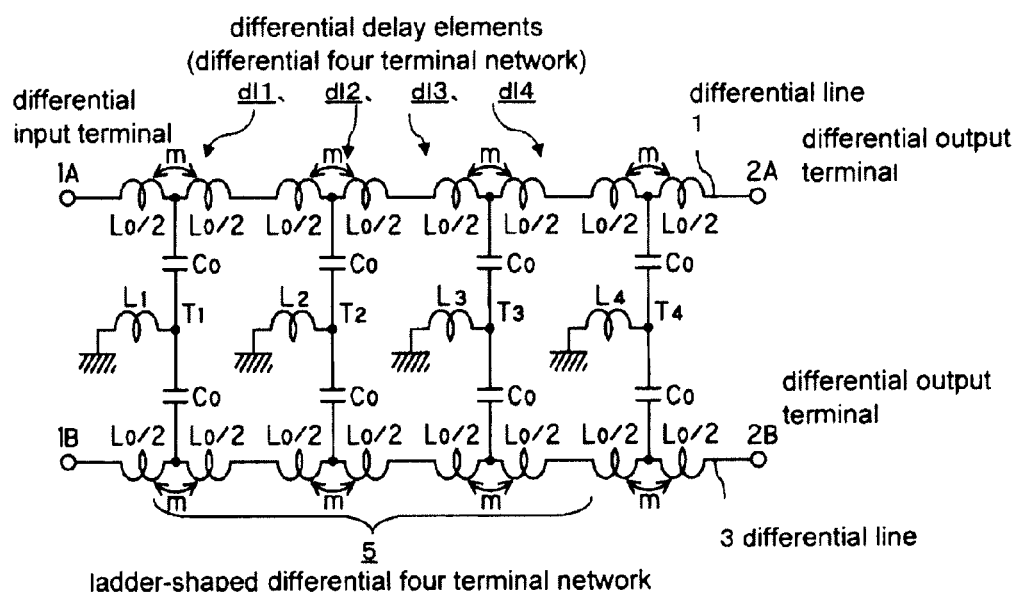
FIG. 5 is a circuit view showing the common mode filter according to a second embodiment of the present invention.

FIG. 5 shows the common mode filter according to a second embodiment of the present invention, which is based on an derived mT-type lumped-constant differential delay line composed of four sections.

Namely, the common mode filter of the second embodiment is composed of four differential delay elements dl1 to dl4, and in each differential delay element dl1 to dl4, inductors Lo that form the passive series elements are equally divided into two, then the equally divided inductors Lo/2 are connected in series, and mutual derived m-coupling is made between them, and connection points of the two equally divided inductors Lo/2 are connected by a series circuit of the capacitors. The other structure is the same as shown in FIG. 1.

In the structure of FIG. 5 as well, parallel elements of each differential four terminal network are converted to the series circuit of two capacitors Co and Co having two-fold capacitance values, and the aforementioned inductors L1 to L4 for attenuating the common mode noise are connected between the connection points T1, T2, T3, T4 of capacitors Co connected in series, and the ground potential.

With this structure, the inductors that constitute the passive series elements of the ladder-shaped differential four terminal network 5 are expressed by (Lo+2m) equivalently, and the passive parallel elements are equivalently converted to a circuit in which the capacitors Co and a negative inductor component −m are connected in series.

Delay time td of one section of each differential delay element dl1 to dl4 is shown by "Formula 3".

$$td=\sqrt{(Lo+2m)Co} \qquad \text{[Formula 3]}$$

Characteristic impedance Zc of each differential delay element dl1 to dl4 is shown by "Formula 4".

$$Zc=2\sqrt{(Lo+2m)/Co} \qquad \text{[Formula 4]}$$

Figure 6:
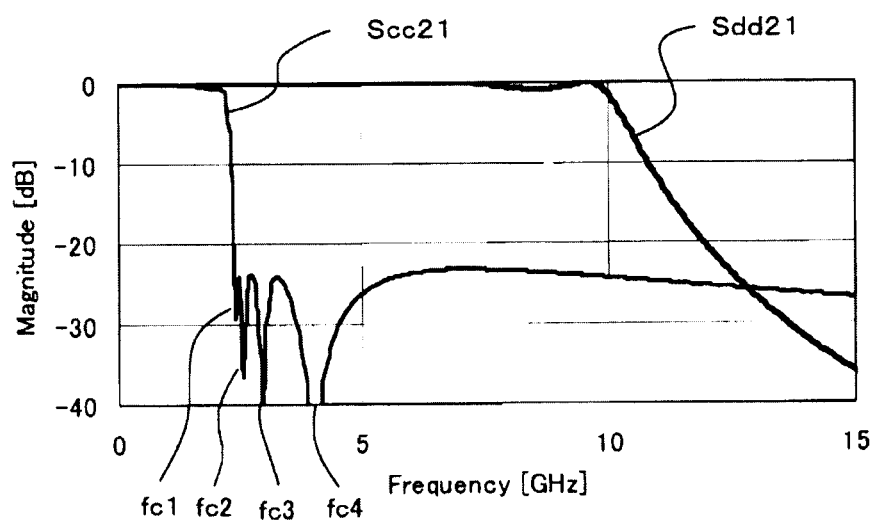
FIG. 6 is a characteristic view of the common mode filter of the present invention shown in FIG. 5.

FIG. 6 is a characteristic view of the common mode filter shown in FIG. 5, and in the figure, Sdd21 indicates the differential signal transmission characteristic, and Scc21 indicates the common mode noise transmission characteristic. This is an example that the constant of each element is defined so that the delay time of one section is set to 37.5 ps and the characteristic impedance is set to 100 ohms.

Note that in a circuit analysis, instead of the value of the mutual induction m, as shown in "Formula 5" as will be described later, the ratio of the mutual induction m with respect to the inductor Lo/2, namely coupling coefficient k is used generally, wherein k=0.24.

$$k=m/(Lo/2) \qquad \text{[Formula 5]}$$

In this case, the series resonance frequency for determining fc1 to fc4 in the figure is determined by 2×Co and a value obtained by subtracting m/2 from each value of the inductors L1 to L4 for attenuating the common mode noise. Therefore, each resonance frequency of the differential delay elements dl1 to dl4 is set, so that fc1 is the series resonance frequency determined by (L4−m/2) and 2×Co, which is 2.39 GHz here;

fc2 is the series resonance frequency determined by (L3−m/2) and 2×Co, which is 2.54 GHz here;

fc3 is the series resonance frequency determined by (L2−m/2) and 2×Co, which is 2.94 GHz here; and fc4 is the series resonance frequency determined by (L1−m/2) and 2×Co, which is 3.99 GHz here. As a result, the attenuation of the common mode noise can be set to −23 dB or more, at the frequency of 2.36 GHz or more.

Figure 7:
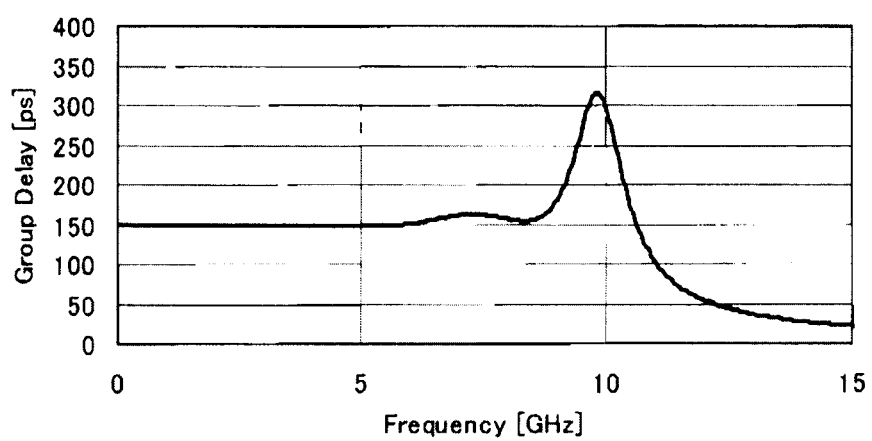
FIG. 7 is a characteristic view of the common mode filter of the present invention shown in FIG. 5.

FIG. 7 shows a group delay characteristic of the differential signal shown by the common mode filter. In the derived m-type structure, it is said that the group delay characteristic is better than a constant K-type, and this is verified in comparison with FIG. 4.

Figure 8:
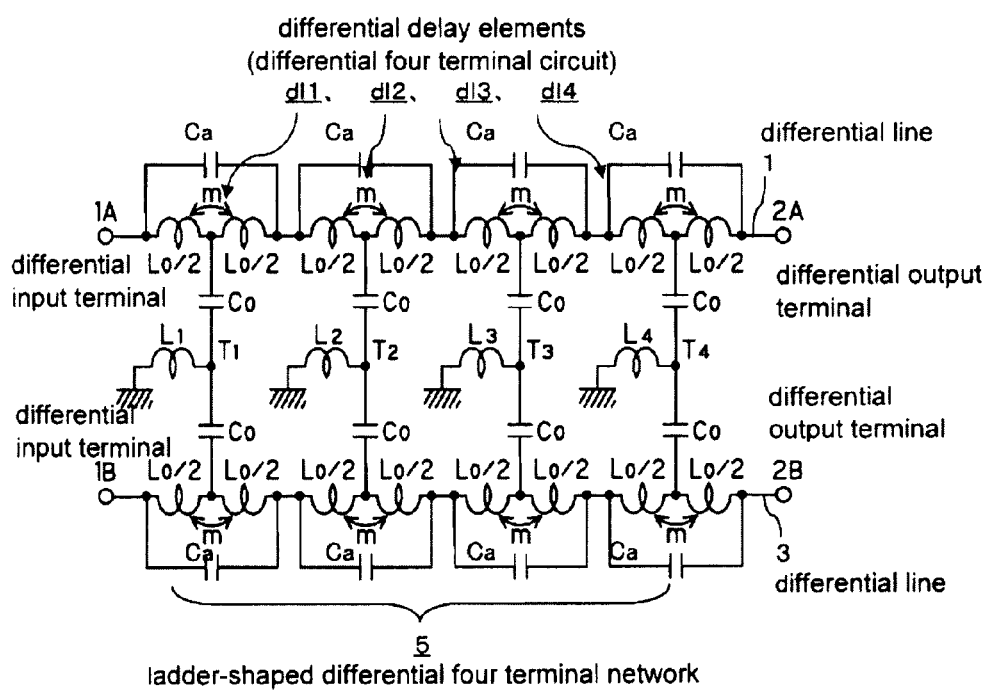
FIG. 8 is a circuit view showing the common mode filter according to a third embodiment of the present invention.

FIG. 8 shows the common mode filter according to a third embodiment of the present invention, having a structure of all pass lumped-constant differential delay line.

Namely, the all pass lumped-constant differential delay line is composed of four differential delay elements dl1 to dl4, and in each differential delay element dl1 to dl4, inductors Lo that form the passive series elements are equally divided into two, then the equally divided inductors Lo/2 are connected in series, and mutual derived m-coupling is made between them. Further, both ends of the inductors Lo/2 connected in series are bridged by capacitor Ca, and the connection points of the differential lines 1 and 3 are connected by the series circuit of the capacitors Co. The other structure is the same as the structure of FIG. 5.

With this structure, regarding the inductors that constitute the passive series elements of the ladder-shaped differential four terminal network, the inductors for determining the delay time of one section are expressed by (Lo+2m) equivalently, and the parallel elements are equivalently converted to a circuit in which the capacitors Co and the negative inductor component-m are connected in series.

In this structure as well, the parallel elements are converted to two capacitors connected in series having two-fold capacitance values, and the connection points of the two capacitors Co connected in series are set as T1, T2, T3, T4 sequentially from the side of the differential input terminals 1A and 1B, and the inductors L1 to L4 for attenuating the common mode noise are connected between each connection point T1 to T4 of them and the ground potential. The other structure is the same as the structure of FIG. 5.

The delay time td of one section in each differential delay element dl1 to dl4 with this structure is shown by "Formula 6".

$$td=\sqrt{(Lo+2m)Co} \qquad \text{[Formula 6]}$$

Characteristic impedance Zc in each differential delay element dl1 to dl4 is shown by "Formula 7".

$$Zc=2\sqrt{(Lo+2m)/Co} \qquad \text{[Formula 7]}$$

Figure 9:
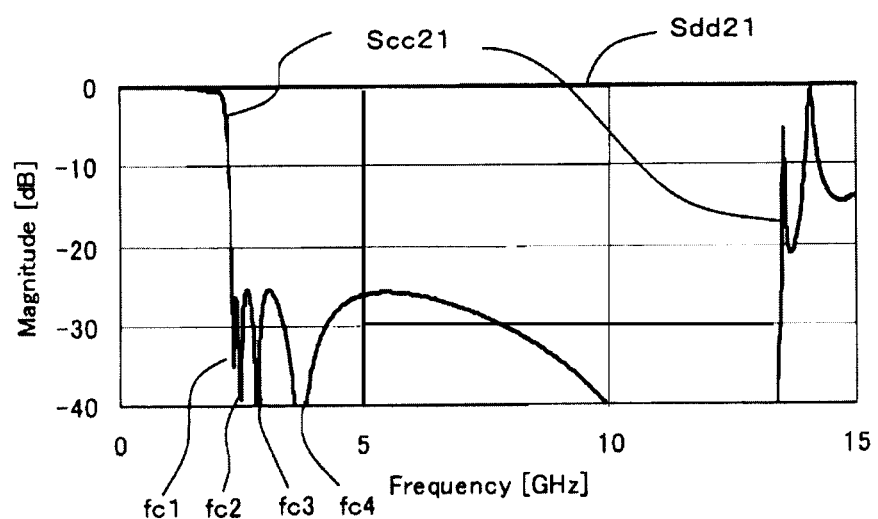
FIG. 9 is a characteristic view of the common mode filter of the present invention shown in FIG. 8.

FIG. 9 is a characteristic view of the common mode filter shown in FIG. 8, and Sdd21 indicates the differential signal transmission characteristic, and Scc21 indicates the common mode noise transmission characteristic. As the characteristic of FIG. 9, an example is shown in which the constant of each element is defined so that the delay time of one section is 37.5 ps, and the characteristic impedance is 100 ohms.

In the structure of FIG. 8 as well, similarly to a case of FIG. 5, the coupling coefficient k is used instead of the mutual induction m, wherein k=0.42 here. In a case of the all pass lumped-constant differential delay line of FIG. 8, the coupling coefficient is preferably set to be a larger value than a case of the derived m-type.

Further, bridge capacitor Ca is disposed, and when the coupling coefficient k is 0.42, a value of about 1/10 of the capacitors Co is used for the bridge capacitor Ca. In this case, the series resonance frequency for determining fc1 to fc4 in the figure is determined by a value obtained by subtracting m/2 from each value of L1 to L4, and 2×Co. Therefore, each resonance frequency is set, so that fc1 is the series resonance frequency determined by (L4−m/2) and 2×Co, which is 2.39 GHz here;

fc2 is the series resonance frequency determined by (L3−m/2) and 2×Co, which is 2.53 GHz here;

fc3 is the series resonance frequency determined by (L2−m/2) and 2×Co, which is 2.9 GHz here; and fc4 is the series resonance frequency determined by (L1−m/2) and 2×Co, which is 3.9 GHz here. As a result, the attenuation of the common mode noise can be set to −25 dB or more, at frequency of 2.36 GHz or more.

In the all pass lumped-constant delay line, the amplitude characteristic of the differential signal is extremely flat, and there is almost no amplitude fluctuation.

Figure 10:
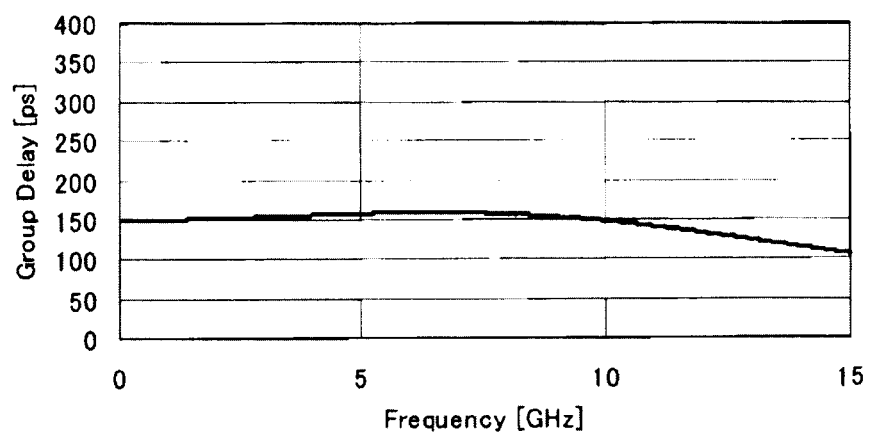
FIG. 10 is a characteristic view of the common mode filter of the present invention shown in FIG. 8.

FIG. 10 is a group delay characteristic of the differential signal shown by the common mode filter of FIG. 8. Further more flat characteristic than the derived m-type is obtained.

As is clarified from FIG. 9, the common mode noise can pass at the frequency of 13 GHz or more. However, the frequency of 2.5 GHz corresponds to harmonics of five times or more, and therefore ordinarily, this is not a problem. In a case that this is a problem, the all pass lumped-constant differential delay line and the other low pass delay line can be combined.

Next, regarding the common mode filter according to the present invention, a suppression effect against a reflected common mode noise, for a signal such as a data signal of 5 Gbit/second is confirmed.

Figure 11:
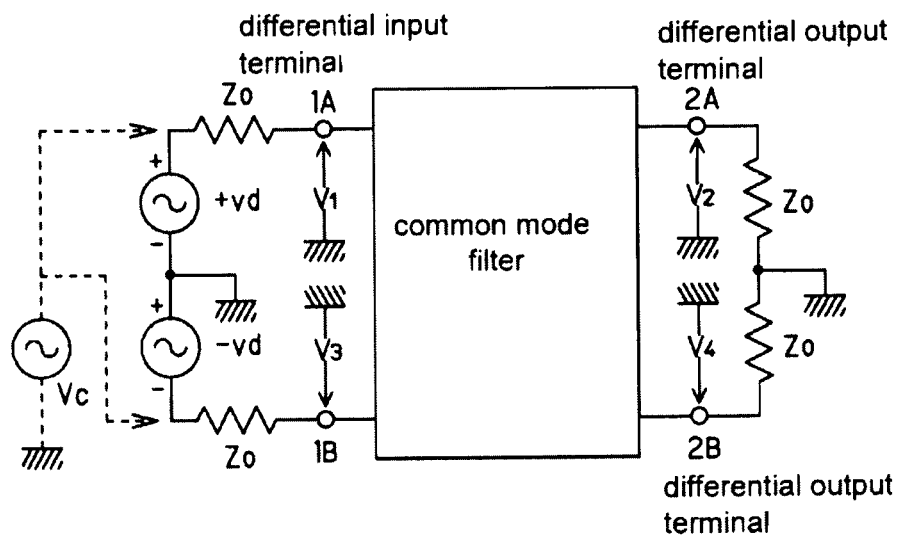
FIG. 11 is a circuit view for explaining an operation of the common mode filter of the present invention.

As shown in FIG. 11, it is assumed that an insertion component such as common mode filter or common mode choke coil is connected to differential power sources +vd and −vd, and output is matched and terminated. Vc in FIG. 11 indicates a common mode noise source.

The common mode noise is sometimes synchronized and is sometimes not synchronized with the differential signal. However, a case of being synchronized will be described for simplifying the explanation.

Here, a so-called differential skews is generated, wherein phases of the differential power sources +vd and −vd are deviated from each other between a positive phase and a negative phase, thus generating the voltage of the same phase component between the positive phase and the negative phase. The same phase component results in the common mode noise.

In FIG. 11, output waveforms V1 to V4, common mode noises V1+V3 of an input terminal part, and common mode noises V2+V4 of an output terminal part, are obtained in a case that potentials of the differential input terminals 1A and 1B are set as V1, V3, and potentials of the differential output terminals 2A, 2B are set as V2, V4, and 50 ps of the differential skews is generated, which are shown in FIG. 12 to FIG. 19. Note that in order to simplify a signal pattern, a signal is set as a repetition signal (corresponding to 2.5 GHz clock) of "0" and "1".

This is confirmed by a third structure of FIG. 8 of the present invention as described above. The reason is as follows. The structure of FIG. 8 is suitable for comparison, because it has most excellent cut-off characteristic of the common mode noise, with greatest reflected common mode noise power reversely, and has reflected common mode noise power not inferior to FIG. 19 in which the cut-off characteristic of a conventional example is shown.

The meaning of each figure is as shown in "table 1".

TABLE 1

Figure 18:
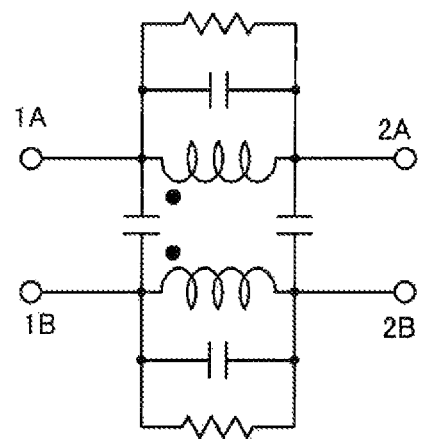
FIG. 18 is an equivalent circuit of the conventional common mode choke coil.
Figure 19:
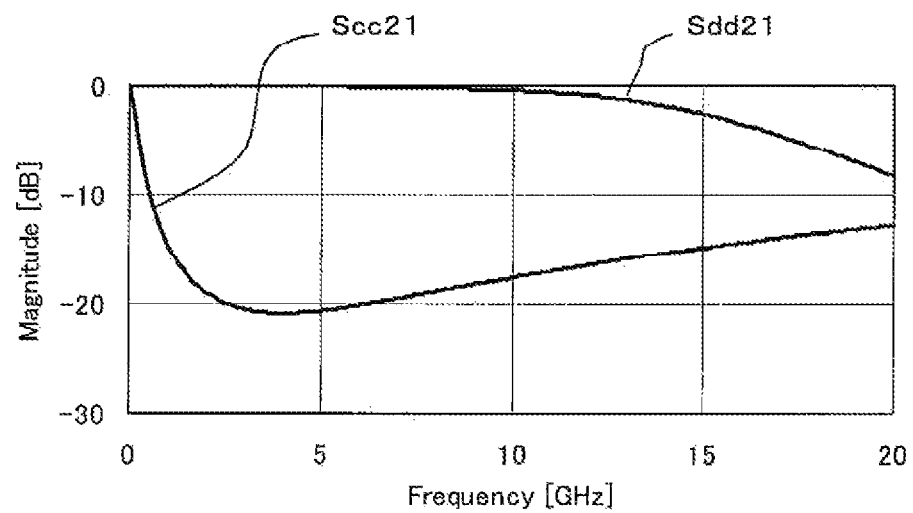
FIG. 19 is a characteristic view of the conventional common mode choke coil shown in FIG. 18.

| FIG. | Insertion component | Display contents |
| --- | --- | --- |
| 12 | FIG. 8 (The present invention product) | Input/output waveform of each line V1 to V4 |
| 13 | FIG. 18 (Conventional example) | |
| 14 | FIG. 8 (The present invention product) | Input side common mode noise, V1 + V3 and output side common mode noise, V2 + V4 |
| 15 | FIG. 18 (Conventional example) | |

TABLE 1-continued

| FIG. | Insertion component | Display contents |
| --- | --- | --- |
| 16 | FIG. 8 (The present invention product) | Spectrum of input side common mode noise |
| 17 | FIG. 18 (Conventional example) | |

Figure 12:
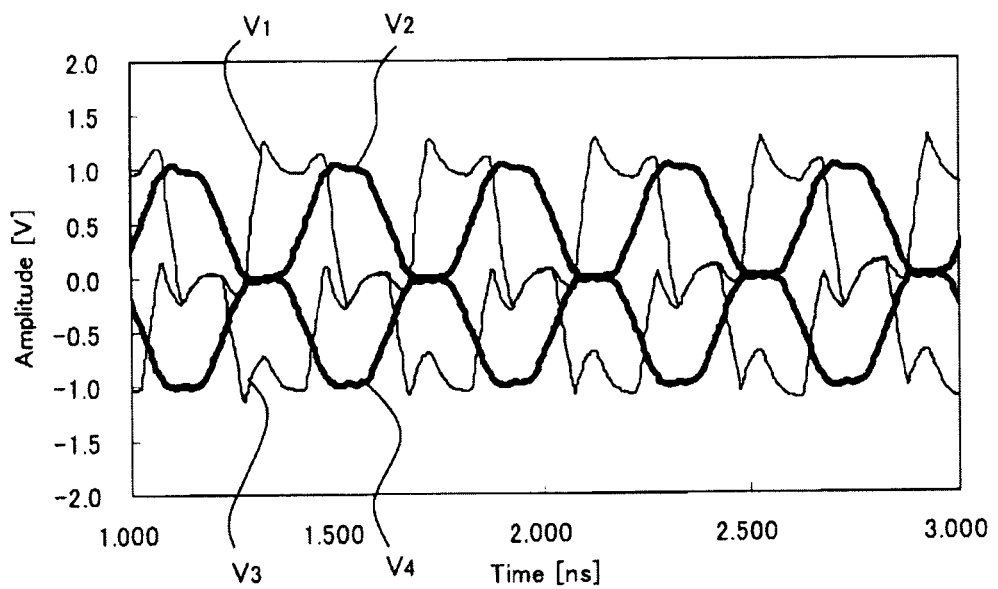
FIG. 12 is a pulse response waveform in the common mode filter of the present invention shown in FIG. 8.
Figure 13:
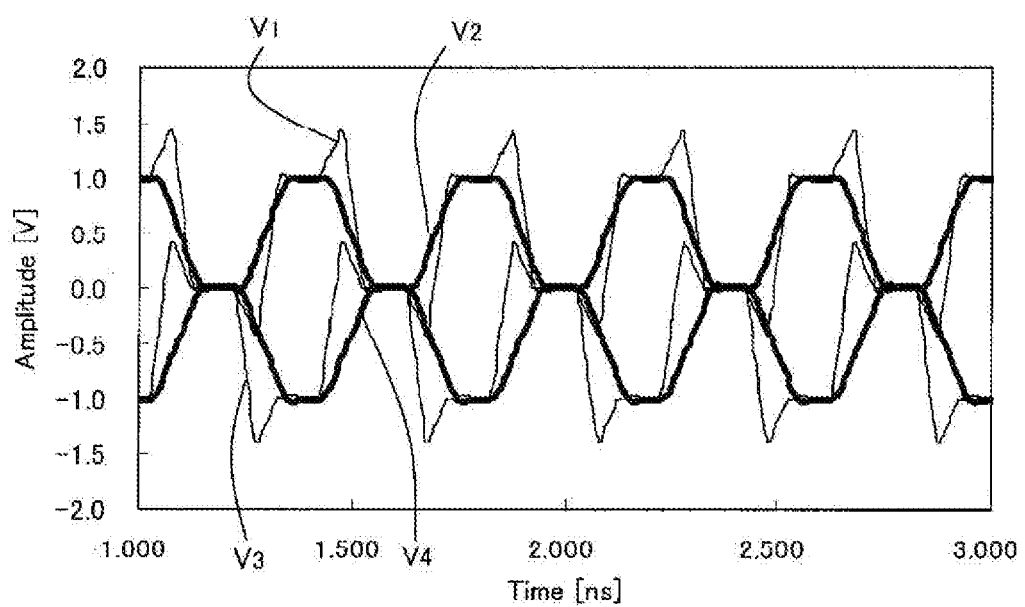
FIG. 13 is a pulse response waveform in a conventional common mode choke coil shown in FIG. 18.

When FIG. 12 and FIG. 13 are compared, in a case that the common mode choke coil of FIG. 18, being a conventional example, is inserted, it is found that a spike-shaped noise is superimposed on the signals V1 and V3 of the input side.

Figure 14:
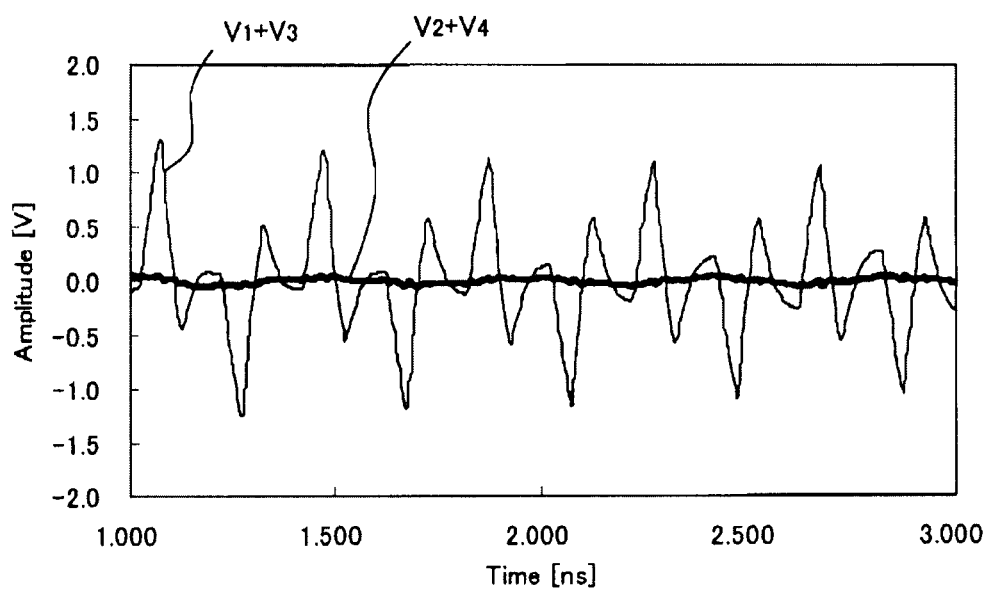
FIG. 14 is a waveform of a common mode noise in the common mode filter of the present invention shown in FIG. 8.
Figure 15:
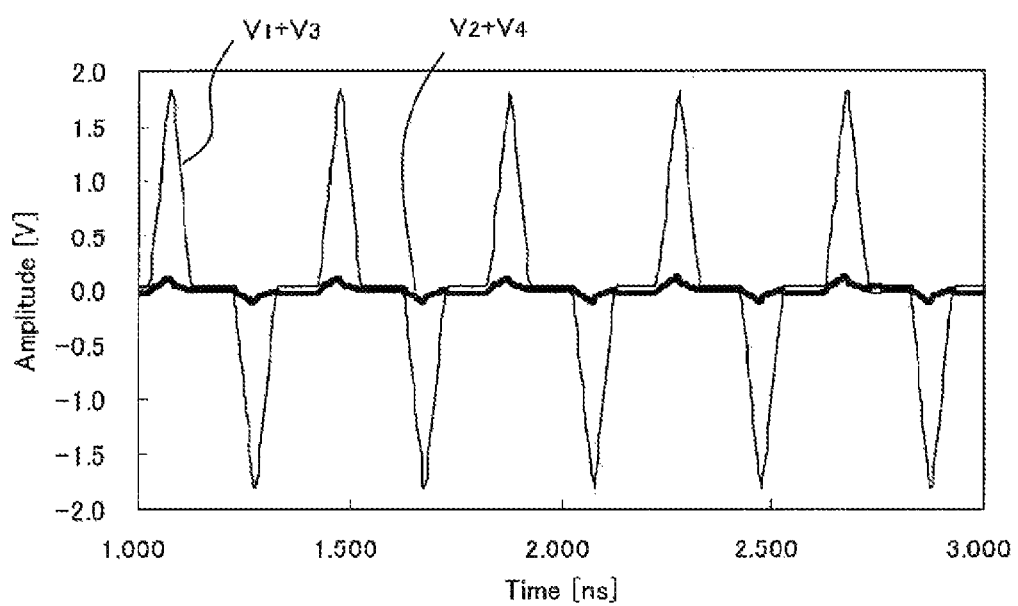
FIG. 15 is a waveform of the common mode noise in the conventional common mode choke coil shown in FIG. 18.

Therefore, a waveform for extracting only the same phase component, namely, the common mode noise, from an input/output waveform, is shown in FIG. 14 and FIG. 15. As shown in FIG. 15, when the common mode choke coil of FIG. 18 is inserted, it is found that the common mode noise of the input side shows a large peak voltage, and the cut-off common mode noise is superimposed at the input terminal.

Meanwhile, when the common mode filter of the present invention shown in FIG. 8 is inserted, FIG. 14 shows a state that the common mode noise reflected by cut-off, is dispersed time-dividedly.

Figure 16:
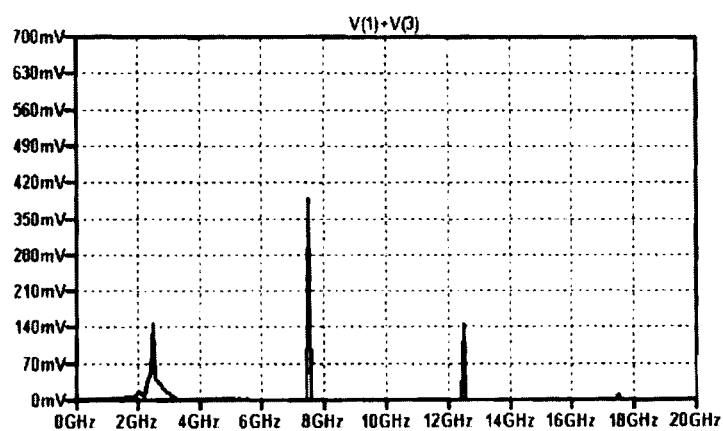
FIG. 16 is a spectrum of the common mode noise in the common mode filter of the present invention shown in FIG. 8.
Figure 17:
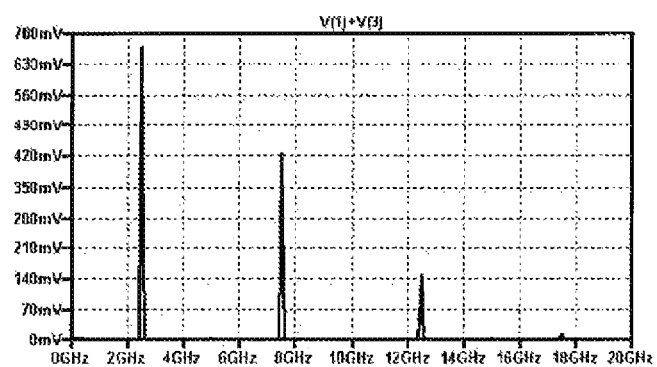
FIG. 17 is a spectrum of the common mode noise in the conventional common mode choke coil shown in FIG. 18.

Therefore, when a frequency spectrum of the common mode noise at the input side is examined, as is found from the comparison between FIG. 16 and FIG. 17, it is found that a peak value of the common mode filter of the present invention shown in FIG. 8 is obviously lower.

As described above, the suppression effect against the peak value of the reflected common mode noise is shown in a case that the common mode noise is synchronized with the differential signal. Such an effect can be obtained by disposing attenuation poles for attenuating a plurality of common mode noises with different attenuation pole frequency, in the lumped-constant differential delay line, by setting a time difference. Therefore, it is found that similar suppression effect can be obtained even in a case that the common mode noise and the differential signal are not synchronized with each other.

Such an effect is shown by a result of analyzing a case of the present invention shown in FIG. 8. However, similar suppression effect can be obtained in all cases, provided that the delay line is the lumped-constant differential delay line.

Further, in a case of the common mode filter of the present invention, explanation is given using three kinds of the lumped-constant differential delay lines such as constant K-type, derived m-type, and all pass type. However, the other structure may also be possible.

For example, in the derived m-type, mutual induction occurs between adjacent sections of the inductors, being series elements of the ladder-shaped lumped-constant differential delay line. Meanwhile, although not shown, it is known that the mutual induction also occurs between the inductors of a section separated from each other by 2 sections or more, and with this structure as well, the structure of the present invention can be applied, and similar effects can be obtained.

Point is that the object of the present invention can be achieved by a structure of the lumped-constant differential delay line, wherein two or three different delay elements are combined, for example, two constant K-type differential delay elements and three derived m-type differential delay elements are connected in a ladder shape, out of the constant K-type, derived m-type, and all pass type differential delay elements.

Further, although not exemplified, a group delay flat type low pass filter can also be used as other lumped-constant differential delay line.

However, the structure of the group delay flat type low pass filter is seemingly similar to the constant K-type structure. However, in the structure composed of a plurality of sections, values of the inductors, being passive series elements, and capacitors, being passive parallel elements, are completely different when the signal is formed as a single end signal. Therefore, such a group delay flat type low pass filter is complicated when it is commercialized.

As described above, the common mode filter of the present invention is constituted based on the lumped-constant differential delay line wherein the inductors are arranged as the passive series elements, and the capacitors are arranged as the passive parallel elements in the ladder-shaped differential four terminal network. Such a common mode filter is capable of passing a desirable ultrahigh speed differential signal propagated through the ultrahigh speed differential transmission line, and meanwhile, attenuating an undesirable common mode noise and allowing it not to pass, and further suppressing the peak value of the reflected common mode noise, and suppressing intensity of the electromagnetic radiation of the reflected and cut-off common mode noise.

Further, all examples of the present invention have been explained in a case that the lumped-constant differential delay line has a structure of a plurality of sections. However, a case that the common mode noise exists only in a specific frequency, can also be considered. In this case, for example, the lumped-constant differential delay line of FIG. 5 has only one section of the derived mT-type, and the frequency of only one attenuation pole may coincide with the frequency of the common mode noise.

Note that in the common mode filter of the present invention, when there are a plurality of sections, a conventional differential delay line, such as differential delay line in which inductors L1 to L4 for attenuating the common mode noise are omitted, can be partially used and connected in series.

DESCRIPTION OF SIGNS AND NUMERALS 1A, 1B Differential input terminals (input side)
2A, 2B Differential output terminals (output side)
1, 3 Differential lines
5 Ladder-shaped differential four terminal network
Co, Co/2, Co/4, Ca Capacitors
DL Lumped-constant differential delay line
dl1, dl2, dl3, dl4 Differential delay elements (differential four terminal network)
Lo, Lo/2 Inductors
L1, L2, L3, L4 Inductors for attenuating common mode noise
T1, T2, T3, T4 Connection points
+vd, −fd Differential power source
Vc Common mode noise source

What is claimed is:
1. A common mode filter, comprising:
a lumped-constant differential delay line of m derived type or all pass type formed by arranging inductors, being passive series elements, and capacitors, being passive parallel elements, in a differential four terminal network composed of the passive series elements arranged in series in each differential line and the passive parallel elements arranged in parallel between the differential lines,
wherein two of the capacitors having same values and forming equivalent capacitance for the passive parallel elements are connected in series;
an additional inductor is provided for attenuating a common mode noise connected between a connection point of the two capacitors connected in series and a ground potential, so that attenuation poles for attenuating the common mode noise are formed together with the two capacitors,
wherein the lumped-constant differential delay line, the two series capacitors, and the additional inductor are formed as differential delay elements of a section, and a plurality of differential delay elements are arranged in the differential delay line in series in a ladder shape, thus composing a plurality of sections; and each section comprises on each differential line, two equally divided series inductors having a mutual inductance, and the two series capacitors in each section are connected in parallel between respective midpoints of the corresponding two equally divided series inductors.
2. The common mode filter according to claim 1, wherein the lumped-constant differential delay line is a composite line comprising distinct elements, the distinct elements are either all or two of the three from the group consisting of constant K-type, m derived type, and all pass type differential delay elements.
3. The common mode filter according to claim 2, wherein frequencies of the attenuation poles in the differential delay elements, are set to be different from each other.
4. The common mode filter according to claim 3, wherein the frequency of the attenuation pole in the differential delay elements at input/output sides of the differential delay line are set higher than the respective frequency of the attenuation pole in the corresponding differential delay elements between the input/output sides.
5. The common mode filter according to claim 1, wherein frequencies of the attenuation poles each of in the differential delay elements are set to be different from each other.
6. The common mode filter according to claim 5, wherein the frequency of the attenuation pole each of in the differential delay elements at input/output sides of the differential delay line are set higher than the respective frequency of the attenuation pole in the corresponding differential delay elements between the input/output sides.

* * * * *